United States Patent
Wachinger

(10) Patent No.: US 9,981,668 B2
(45) Date of Patent: May 29, 2018

(54) OPERATOR CONTROL DEVICE AND METHOD FOR ACTUATING FUNCTIONAL UNITS OF A MOTOR VEHICLE

(71) Applicant: AUDI AG, Ingolstadt (DE)

(72) Inventor: Michael Wachinger, Winkelhausen (DE)

(73) Assignee: AUDI AG, Ingolstadt (DE)

( * ) Notice: Subject to any disclaimer, the term of this patent is extended or adjusted under 35 U.S.C. 154(b) by 5 days.

(21) Appl. No.: 15/329,145

(22) PCT Filed: Oct. 31, 2015

(86) PCT No.: PCT/EP2015/002191
§ 371 (c)(1),
(2) Date: Jan. 25, 2017

(87) PCT Pub. No.: WO2016/082909
PCT Pub. Date: Jun. 2, 2016

(65) Prior Publication Data
US 2017/0210393 A1     Jul. 27, 2017

(30) Foreign Application Priority Data

Nov. 27, 2014   (DE) .................. 10 2014 017 577

(51) Int. Cl.
*H04B 3/36*     (2006.01)
*B60W 50/08*   (2012.01)
(Continued)

(52) U.S. Cl.
CPC ........... *B60W 50/082* (2013.01); *B60K 37/06* (2013.01); *H02K 1/34* (2013.01); *H02K 11/27* (2016.01);
(Continued)

(58) Field of Classification Search
None
See application file for complete search history.

(56) References Cited

U.S. PATENT DOCUMENTS 5,103,223 A * 4/1992 Humphrey ................ A61F 9/08
                                                                340/407.1
5,189,390 A * 2/1993 Fagard .................... H01H 13/84
                                                                340/407.2
(Continued)

FOREIGN PATENT DOCUMENTS

CN      103453204 A    12/2013
DE      42 30 950 C1   9/1993
(Continued)

OTHER PUBLICATIONS

English Translation of the International Preliminary Report on Patentability and Written Opinion on the International Searching Authority dated May 30, 2017 from International Patent Application No. PCT/EP2015/002191, 7 pages.
(Continued)

*Primary Examiner* — Julie Lieu
(74) *Attorney, Agent, or Firm* — Staas & Halsey LLP

(57) ABSTRACT

At least one operator control element which can be moved by an operator is included in an operator control device. Furthermore, the operator control device includes an actuator with which activation of the operator control element can be communicated to the operator. The actuator includes a coil element and an armature which can move relative to the coil element. The armature is secured to the operator control element. The operator control device also includes an evaluation device with which a position of the armature relative to the coil element can be detected.

16 Claims, 1 Drawing Sheet

(51) Int. Cl.
*H03K 17/97* (2006.01)
*H02K 11/27* (2016.01)
*H02K 1/34* (2006.01)
*B60K 37/06* (2006.01)

(52) U.S. Cl.
CPC ... *H03K 17/97* (2013.01); *H03K 2217/96062* (2013.01)

(56) References Cited

U.S. PATENT DOCUMENTS

| | | | | |
|---|---|---|---|---|
| 5,600,237 | A * | 2/1997 | Nippert | F16D 48/064 |
| | | | | 324/207.16 |
| 6,466,201 | B1 * | 10/2002 | Koizumi | G06F 3/0202 |
| | | | | 345/168 |
| 2008/0128252 | A1 * | 6/2008 | Meyer | F16H 59/12 |
| | | | | 200/5 A |
| 2013/0190973 | A1 * | 7/2013 | Meng | B60K 37/06 |
| | | | | 701/36 |
| 2017/0141665 | A1 * | 5/2017 | Genderjahn | H02K 33/16 |
| 2017/0256348 | A1 * | 9/2017 | Thode | H01F 7/1607 |

FOREIGN PATENT DOCUMENTS

| | | |
|---|---|---|
| DE | 102 43 600 A1 | 4/2004 |
| DE | 10 2009 042 777 A1 | 4/2011 |
| DE | 10 2011 117 120 A1 | 5/2012 |
| DE | 10 2011 018 897 A1 | 10/2012 |
| DE | 10 2012 018 743 A1 | 3/2014 |
| DE | 10 2014 017 577.4 | 11/2014 |
| WO | PCT/EP2015/002191 | 10/2015 |

OTHER PUBLICATIONS

German Office Action dated Sep. 17, 2015, from German Patent Application No. 10 2014 017 577.4, 9 pages.
International Search Report dated Jan. 28, 2016, from International Patent Application No. PCT/EP2015/002191, 6 pages.
Chinese Office Action dated Oct. 9, 2017 from Chinese Patent Application No. 201580038549.2, 6 pages.

* cited by examiner

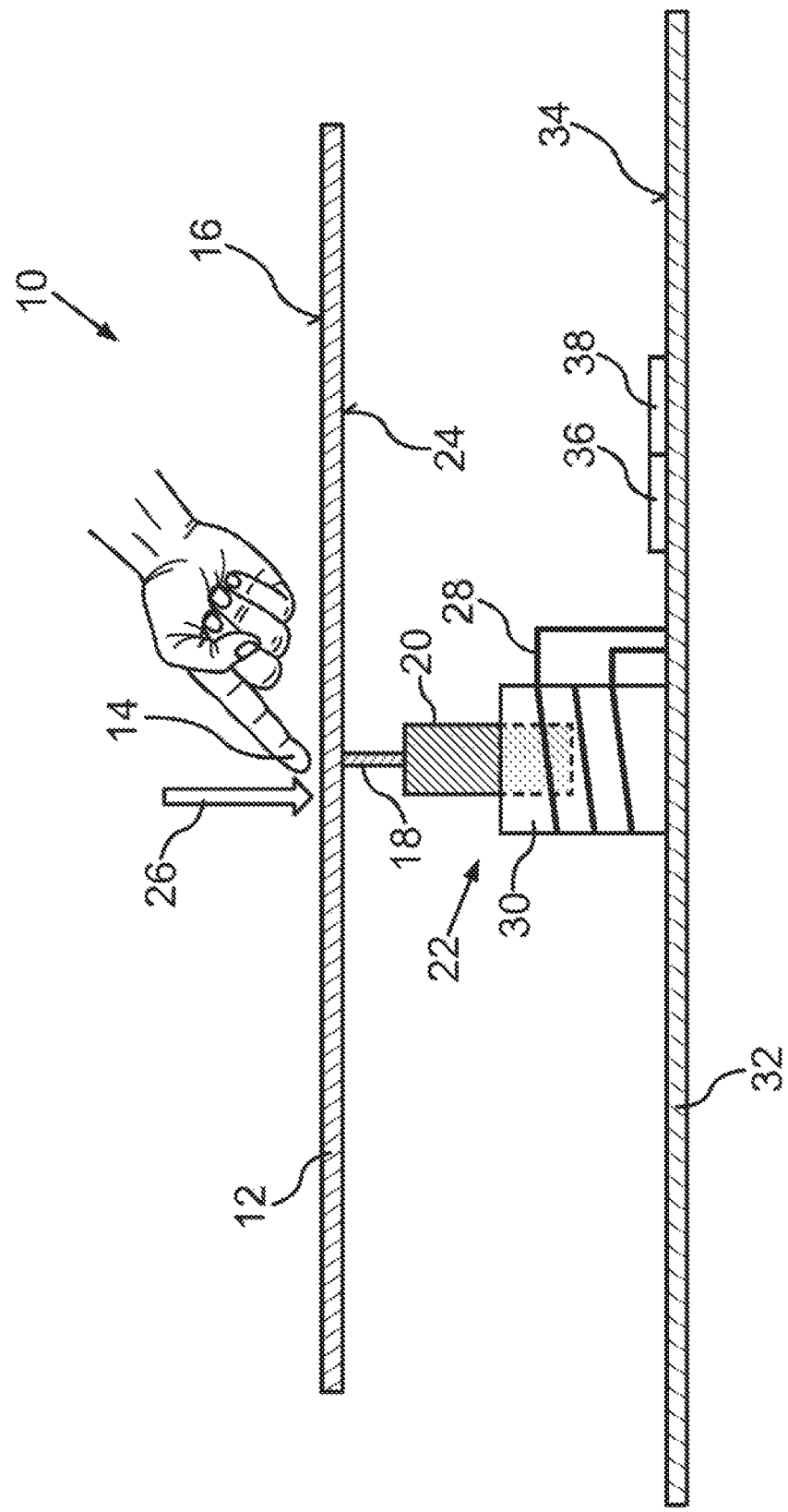

OPERATOR CONTROL DEVICE AND METHOD FOR ACTUATING FUNCTIONAL UNITS OF A MOTOR VEHICLE

CROSS REFERENCE TO RELATED APPLICATIONS

This application is a U.S. national stage of International Application No. PCT/EP2015/002191, filed on Oct. 31, 2015. The International Application claims the priority benefit of German Application No. 10 2014 017 577.4 filed on Nov. 27, 2014. Both the International Application and German Application are incorporated by reference herein in their entirety.

BACKGROUND

Described herein is an operator control device for actuating functional units of a motor vehicle. The operator control device has at least one operator control element which can be moved by an operator. The operator control device further includes an actuator by which operation of the operator control element can be communicated to the operator. The actuator includes a coil element and an armature which can move relative to the coil element. Also described herein is a method for actuating functional units of a motor vehicle.

German Patent Application No. 10 2011 117 120 A relates to an operator control panel for a motor vehicle. The operator control panel has operating areas on which an operator control force can be exerted by a finger of a human hand. A strain gauge is provided in order to determine the operator control force. If operation of an operating area is established, haptic feedback is communicated to an operator by current being applied to a solenoid including a coil and an armature which is arranged therein in a movable manner. Then, the armature strikes an element, the movement of the element being transmitted to the operating area by using a tappet. This is perceived by the finger of the operator as haptic feedback for operation of the operating area.

One disadvantage of this can be considered to be that the provision of a strain gauge for detecting the operator control force is complicated, costly and susceptible to faults.

Furthermore, German Patent Application No. 102 43 600 A1 describes an electrical switch which can be used in motor vehicles. If operation of the switch by using a switching device is detected, current is applied to a coil winding and an armature which is guided in a linear manner in the coil winding is made to execute an oscillating movement, the armature striking the switch in the event of the oscillating movement. This is perceived by an operator as vibration of the switch.

German Patent Application No. 10 2009 042 777 A1 describes an electromagnetic actuator for operating a switch or a valve, for example in order to set a through-flow rate through the valve. Here, the electromagnetic actuator includes a coil and an armature which can be moved by supplying current to the coil and to which a tappet is connected. A measuring apparatus for determining an armature position includes a current sensor and a magnetic field sensor.

SUMMARY

The problem addressed herein is that of providing an operator control device of the kind described above, which operator control device has a simplified design, and a simplified method.

This problem is solved by an operator control device as described herein and by a method for operating the operator control device as described herein. Advantageous refinements together with expedient developments are further described herein.

In the case of the operator control device as described herein, the armature is secured to the operator control element. In addition, the operator control device includes an evaluation device by which a position of the armature relative to the coil element can be detected. Since the position of the armature relative to the coil element can be detected by using the evaluation device, the actuator can be used as a sensor which detects operation of the operator control element. This leads to a particularly simple design of the operator control device. Specifically, it is possible to dispense with a separate sensor for detecting operation of the operator control element. Furthermore, the possibility of faults can be reduced in this way since particularly few components are used for providing the operator control device.

The armature can be formed, at least in regions, from a magnetic and/or magnetizable material. Here, the evaluation device is designed to detect a current flow through the coil element. Inductive evaluation of this kind when using the actuator as a sensor can be realized in a particularly simple manner.

If the armature or a part of the armature is formed from the magnetizable material, the magnetic properties of the armature, which magnetic properties are acquired when current is supplied to the coil element on account of the magnetic field which is generated at a result, can be utilized. This makes provision of the armature particularly cost-effective.

In addition or as an alternative, the evaluation device can be designed to set a current flow through the coil element, which current flow is lower than a current flow which has to be set in order to move the armature. Here, the evaluation device is additionally designed to detect a magnetic flux density which is present in the region of the coil element. The low current flow through the coil element ensures that the armature remains in a specific position relative to the coil. Therefore, the low current flow through the coil element is not sufficient to move the armature relative to the coil element and therefore to communicate feedback about operation of the operator control element to the operator. However, operation of the operator control element and therefore active movement of the armature by the operator then leads to a change in the magnetic flux density in the region of the coil element.

A change in the magnetic flux density as a result of the movement of the armature relative to the coil element can be established in a particularly simple and accurate manner. Therefore, in this way, the position of the armature relative to the coil element can be detected in a particularly simple and accurate manner.

The evaluation device can be designed, in particular, to set a pulsed current flow through the coil element, that is to say current pulses which follow one another over time and alternate with time periods in which no current is supplied to the coil element. Therefore, it is possible to ensure in a particularly simple manner that the current flow through the coil element does not lead to movement of the armature relative to the coil element.

It has been found to be further advantageous if the evaluation device is designed to determine an operating force which the operator applies in order to move the operator control element. In this case, it is specifically possible to establish in a particularly reliable manner whether the operator actually wishes to operate the operator control element or is merely inadvertently touching the operator control element.

It has been found to be further advantageous if a control device is provided, which control device is designed to actuate the actuator depending on a signal from the evaluation device. Therefore, if the evaluation device detects the position of the armature relative to the coil element, a corresponding signal can be output to the control device. This then, in turn, leads to the control device applying current to the coil element and in this way ensuring that the actuator communicates feedback of operation of the operator control element, for example feedback which can be detected in a haptic manner, to the operator. This makes operation of the operator control element particularly convenient for the operator.

It has been found to be advantageous here if the control device is designed to actuate the actuator when the operating force is greater than a predetermined threshold value of the operating force. In this way, it is possible to ensure in a particularly simple manner that the situation of the operator operating the operator control element is communicated to the operator only when the threshold value of the operating force is exceeded. This makes the operator control device particularly reliable in respect of operation.

The coil element can be arranged on a side of a printed circuit board which faces a side of the operator control element to which the armature is secured. In this case, it is not necessary to provide a separate stator or the like on which the coil element is arranged. This makes the operator control device particularly simple and comparatively compact.

A particularly compact design of the operator control device can furthermore be realized if the coil element is formed by conductor tracks which are integrated into the printed circuit board. This leads specifically to a particularly low installation space requirement by the coil element.

Finally, it has been found to be advantageous if the operator control device has a plurality of operator control elements with which a respective actuator is associated. Here, the operator control elements are arranged in at least one row. Particularly in the case of operator control elements which are arranged in rows, as occur in the form of switch panels in motor vehicles for example, it is specifically particularly advantageous for the operator when feedback relating to operation of the respective operator control element is communicated to the operator.

In the case of the method described herein for actuating functional units of a motor vehicle, at least one operator control element of an operator control device is moved by an operator. Here, an armature, which is secured to the operator control element, of an actuator of the operator control device is also moved at the same time on account of the operator control element moving. A position of the armature relative to a coil element of the actuator is detected by using an evaluation device of the operator control device. Operation of the operator control element is then communicated to the operator by using the actuator by the armature being moved relative to the coil element. In the case of this method, feedback relating to operation of the operator control element having been performed can be sent or communicated to the operator in a particularly simple manner since the actuator is used as a sensor at the same time.

The features and combinations of features cited in the description above and the features and combinations of features cited in the description of the drawing discussed below and/or shown in the drawing on their own can be used not only in the respectively indicated combination but also in other combinations or on their own without departing from the scope of the disclosure. Therefore, embodiments which are not explicitly shown in the drawing or explained but are apparent and can be produced by separated combinations of features from the embodiments explained herein are also considered to be covered and disclosed.

BRIEF DESCRIPTION OF THE DRAWINGS

These and other aspects and advantages will become more apparent and more readily appreciated from the following description of the exemplary embodiments, taken in conjunction with the accompanying drawing of which:

An exemplary embodiment in the single drawing is a schematic view of an operator control device for actuating functional units of a motor vehicle.

DETAILED DESCRIPTION OF THE PREFERRED EMBODIMENT

Reference will now be made in detail to example embodiments which are illustrated in the accompanying drawing. Within the single drawing, elements that are the same or similar are provided with the same reference numeral.

Further advantages, features and details of the operator control device can be gathered from the claims, the description of example embodiments which follows and on the basis of the single drawing.

The drawing schematically shows an operator control device for actuating functional units of a motor vehicle, in which operator control device an armature which is coupled to an operator control element is moved relative to a coil, wherein an actuator which includes the armature and the coil is used as a sensor for detecting this movement.

An operator control device 10, which is schematically shown in the drawing, serves to actuate functional units of a motor vehicle. By way of example, a hazard warning system or a windscreen heater can be switched on or switched off by using the operator control device 10. The operator control device 10 can also be used for setting a driving mode, such as a sport driving mode, a defensive driving mode or a fuel-saving driving mode for example, and to activate or to deactivate a driver assistance system and also further convenience functions and/or safety functions, such as an electronic stability program for the example.

To this end, the operator control device 10 can have a plurality of operator control parts or operator control elements 12, one of which is schematically shown in the drawing. Operator control elements 12 of this kind can be arranged, in particular, in a row in a switch panel. The at least one switch panel can be arranged in an instrument panel, in a center console, in the region of a door panel or on another interior fitting part of the motor vehicle.

According to an example embodiment, the operator control element 12 can be operated by an operator, for example using a finger 14, exerting a force onto a surface 16 of the operator control element 12 and deforming the operator control element 12 in the process. An armature 20 of an actuator 22 is connected to the operator control element 12 by using a shaft 18. Here, the shaft 18 is secured to a bottom side 24 of the operator control element 12. Therefore, if the force which is illustrated by an arrow 26 in the drawing is exerted onto the surface 16 of the operator control element 12, the armature 20 of the actuator 22, which armature is arranged on the bottom side 24 of the operator control element 12, likewise moves.

In the case of the operator control device 10 schematically shown in the drawing, the armature 20 can move linearly within the windings of a coil 28 of the actuator 22, which coil is wound around a stator 30 in an embodiment. In alternative embodiments, other refinements of a coil element, which is designed as the coil 28 in the example embodiment, can also be provided.

In the example embodiment, an evaluation device or evaluation electronics system 36 is arranged on a printed circuit board 32 which has a top side 34 which faces the operator control element 12. This evaluation electronics system 36 makes it possible to determine the position of the armature 20 relative to the coil 28. To this end, the armature 20 can be magnetic in regions, or at least one part of the armature 20 can be formed from a magnetizable material. If the magnetic or magnetized armature 20 is then moved relative to the coil 28, this can be detected by the evaluation electronics system 36 on the basis of a current flow through the coil 28.

Therefore, inductive evaluation of the movement of the operator control element 12 is made possible by using the electromagnetic actuator 22, wherein the movement is effected by the operating force which is applied by the finger 14.

In addition or as an alternative, the evaluation electronics system 36 can ensure that a very low current flows through the coil 28. This very low current does not effect movement of the armature 20. However, the low current allows a movement of the armature 20 relative to the coil 28 through which current flows to be detected, this movement originating from the operating force which is applied by the finger 14. The magnetic field which is generated by the coil 28 through which current flows changes when the armature 20 is moved relative to the coil 28 through which current flows. This can be detected by the evaluation electronics system 36.

Parameters, for example in the form of a characteristic curve, can be stored in the evaluation electronics system 36, the parameters correlating with the respective penetration depth of the armature 20 into the coil 28. To this end, the current flow through the coil 28, which current flow is present at the respective penetration depth, can be established. In addition or as an alternative, the evaluation electronics system 36 can detect the magnetic flux density which is present in the region of the coil 28 at the respective penetration depth.

Therefore, conclusions can be drawn about the operating force which is applied by the finger 14 on the basis of the parameters which are stored, for example, in the form of the characteristic curve. If the operating force exceeds a predetermined threshold value, a switching pulse is triggered. Accordingly, an item of switching information is output to a control device 38. The control device actuates the actuator 22 by applying an electric current to the coil 28. This leads to the armature 20 being moved relative to the coil 28. In this way, the operator receives feedback that the operating force was sufficient in order to operate the operator control element 12. By way of example, the actuator 22 can ensure that the operator control element 12 vibrates. Therefore, haptic feedback that the operator control element 12 has been operated is communicated to the operator.

The evaluation electronics system 36 and the control device 38 can also be integrated into an electronic component which then serves both to detect the position of the armature 20 relative to the coil 28 and also to supply current to the coil 28 in order to output the, for example haptic, feedback to the operator in respect of operation of the operator control element 12 having been executed.

In an embodiment (not shown), the coil 28 of the actuator can also be designed directly on the printed circuit board 32 or printed circuit, wherein, in particular, the stator 30 can be dispensed with. Conductor tracks which form the coil 28 can also be integrated directly into the printed circuit board 32 as turns. This results in a particularly compact design of the operator control device 10.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. An operator control device for actuating functional units of a motor vehicle, the operator control device comprising:
   at least one operator control element moveable by an operator;
   an actuator configured to communicate an operation of the at least one operator control element to the operator, the actuator including:
   a coil element, and
   an armature secured to the at least one operator control element and moveable relative to the coil element; and
   an evaluation device configured to determine a position of the armature relative to the coil element.

2. The operator control device as claimed in claim 1, wherein
   the armature is formed, at least in regions thereof, from at least one of a magnetic and a magnetizable material, and
   the evaluation device is configured to detect a current flow through the coil element.

3. The operator control device as claimed in claim 1, wherein
   the evaluation device is configured to set a current flow through the coil element and to detect a magnetic flux density present in a region of the coil element, and
   the current flow set by the evaluation device is lower than a current flow necessary to move the armature.

4. The operator control device as claimed in claim 3, wherein the current flow set by the evaluation device is pulsed.

5. The operator control device as claimed in claim 1, wherein the evaluation device is configured to determine an operating force the operator applies to move the operator control element.

6. The operator control device as claimed in claim 1, further comprising a control device configured to actuate the actuator based on a signal from the evaluation device.

7. The operator control device as claimed in claim 6, wherein
   the evaluation device is configured to determine an operating force the operator applies to move the operator control element, and
   the control device is configured to actuate the actuator when the operating force determined by the evaluation device is greater than a predetermined threshold value.

8. The operator control device as claimed in claim 1, further comprising a printed circuit board having a first side facing a second side of the operator control element to which the armature is secured, the coil element being disposed on the first side of the printed circuit board.

9. The operator control device as claimed in claim 8, wherein the coil element is formed by conductor tracks integrated into the printed circuit board.

10. The operator control device as claimed in claim 1, wherein
the operator control device comprises a plurality of operator control elements with which a respective actuator is associated, and
the plurality of operator control elements are disposed in at least one row.

11. The operator control device as claimed in claim 1, wherein the evaluation device is configured to determine a magnetic flux density present in a region of the coil element, and to determine a penetration depth of the armature into the coil element based on the magnetic flux density and correlation parameters stored in the evaluation device.

12. The operator control device as claimed in claim 1, wherein the evaluation device is configured to determine a current flow through the coil element, and to determine a penetration depth of the armature into the coil element based on the current flow and correlation parameters stored in the evaluation device.

13. A method for actuating functional units of a motor vehicle, the method comprising:
moving, by an operator, at least one operator control element of an operator control device;
moving an armature of an actuator of the operator control device secured to the at least one operator control element, by the moving of the at least one operator control element;
determining, by an evaluation device of the operator control device, a position of the armature relative to a coil element of the actuator; and
communicating, by movement of the armature relative to the coil element, operation of the at least one operator control element to the operator.

14. The method as claimed in claim 13, further comprising outputting a signal, from the evaluation device to a control device of the operator control device, representing the position of the armature relative to the coil element, and
the communicating comprises the control device applying a current to the coil element to cause the movement of the armature relative to the coil element.

15. The method as claimed in claim 13, further comprising:
providing a first current flow through the coil element that does not affect movement of the armature;
in response to the moving of the at least one operator control element by the operator, detecting a change in a magnetic field generated by the coil element through which the current flows, the change in the magnetic field being used by the evaluation device to determine the position of the armature relative to the coil element; and
determining whether an operating force applied by the operator to the at least one operator control element exceeds a predetermined threshold value based on the change in the magnetic field.

16. The method as claimed in claim 15, further comprising:
applying a second current flow to the coil element to cause the movement of the armature relative to the coil element if the operating force exceeds the predetermined threshold value; and
maintaining the first current flow through the coil element if the operating force does not exceed the predetermined threshold value.

* * * * *